United States Patent [19]
Kaneko

[11] 3,735,392
[45] May 22, 1973

[54] BIPOLAR ANALOG-TO-DIGITAL CONVERTER WITH DOUBLE DETECTION OF THE SIGN BIT

[75] Inventor: Hisashi Kaneko, Tokyo, Japan

[73] Assignee: Bell Telephone Laboratories, Incorporated, Murray Hill, Berkeley Heights, N.J.

[22] Filed: Dec. 8, 1971

[21] Appl. No.: 205,793

[52] U.S. Cl. ......340/347 AD, 340/347 CC, 324/99 D
[51] Int. Cl. ....H03k 13/02
[58] Field of Search ....340/347 AD, 347 CC; 324/99

[56] References Cited

UNITED STATES PATENTS 2,974,315 3/1961 Lebel et al....340/347
3,493,958 2/1970 Gorbatenko et al....340/347
3,059,228 10/1962 Beck et al....340/347 X

*Primary Examiner*—Charles D. Miller
*Attorney*—W. L. Keefauver

[57] ABSTRACT

A bipolar sequential analog-to-digital converter is designed to have two sign bit checks. When the first few encoded bits indicate an input signal near zero, the sign bit is rechecked and the result is compared with the first sign bit detection. When the two are the same, the encoder continues to generate the remaining bits of the code. However, when the sign bits do not match, the previously generated bits are corrected before the encoder generates the remaining bits.

8 Claims, 5 Drawing Figures

BIPOLAR ANALOG-TO-DIGITAL CONVERTER WITH DOUBLE DETECTION OF THE SIGN BIT

BACKGROUND OF THE INVENTION

This invention relates to analog-to-digital (A/D) converters and, more particularly, to bipolar sequential analog-to-digital converters for use with time-division multiplexers.

In bipolar PCM time-division multiplex systems, a plurality of bipolar analog signals, representing various channels of information, are applied to the inputs of the multiplexer. This multiplexer sequentially connects the signals of the various channels to a sample and hold circuit which takes a sample of the signal applied to it and holds it until the next signal is connected to it by the multiplexer. While the signal voltage is being held, an analog-to-digital (A/D) converter generates a digital equivalent of the held voltage. In this way a PCM time-division multiplexed version of the various input signals is generated.

The sample and hold circuit in this type of system typically employs a capacitor at the input of a high impedance amplifier. Since each channel will have a source resistance, the charging of the holding capacitor to the channel voltage will not be instantaneous. Instead, it will have a transient response, depending on the values of the channel source resistance and the holding capacitor. When a feedback type successive approximation A/D converter is used, it may be necessary for the converter to wait until the voltage across the holding capacitor has reached a constant value. This is especially true since the voltages of successive channels can have different polarities as well as large magnitude differences. If the converter is not allowed to wait until the voltage sample reaches a constant value and successive channels have opposite polarity signals, it is possible for the sign bit to be erroneously detected. This phenomenon, where the signals of adjacent channels affect each other, is known as crosstalk.

Successive approximation A/D converters compare the input signals with certain preselected voltage levels. When the preselected signal exceeds the input signal, it is removed; a digital "0" bit is generated; and a smaller preselected voltage is compared to the input signal. When a preselected signal which is smaller than the input signal is used, it is kept as part of the comparison; a digital "1" bit is generated; and a still smaller preselected signal is added to the comparison. In this way the combination of progressively smaller preselected signals which most closely approximates the input signal and the resulting digital code are determined. It has been suggested that the difference between the input signal and the first approximation (the preselected voltage if the first bit is a "1" and zero if it is "0") will indicate if a mistake has been made in encoding the sign bit. This will be true because a mistake in the first bit will cause the difference to exceed a maximum level normally expected. When it is determined that the sign bit is incorrect, then steps can be taken to correct it during the generation of the next bit. However, this method requires additional threshold detecting circuitry. It also requires that the check of the sign bit occurs between the first and second bit generation.

It is therefore an object of this invention to provide an A/D converter which can encode a multiplexer output without waiting for the sampled signal to reach a constant value, which does not require additional threshold detecting circuitry, and which can check the sign bit after any convenient bit has been generated.

SUMMARY OF THE INVENTION

The present invention is directed to increasing the speed of a bipolar PCM time-division multiplex system by beginning the decoding process before the signal sample has reached a steady state value and by correcting any resulting errors in response to a subsequent recheck of the sign bit, thereby reducing the effects of channel crosstalk.

In an illustrative embodiment of this invention, various channels of information are fed to a multiplexer which drives a sample and hold circuit. This arrangement samples one of the input channels and holds that voltage while a feedback type successive approximation A/D converter circuit generates a digital equivalent of the held voltage. After the digital representation has been produced, the multiplexer switches to a new channel and its voltage is held while a digital representation of the new sample is produced. The digital representation of the held voltage is obtained by comparing the output of the sample and hold circuit with the output of a local decoder in a comparator circuit at time intervals determined by a local timing circuit. The comparator circuit will produce a digital "1" output if the sample and hold circuit output is more positive than the decoder output at that particular time. When the decoder output is more positive than the sample and hold output, the comparator will produce a digital "0" output. These output bits from the comparator cause the local decoder to change its output voltage, which is the summation of the outputs of its various stages. In the present system the decoder stages have relative outputs equivalent to −16, +8, +4, +2 and +1 for stages 1 through 5, respectively. Since the output of the decoder is initially set to zero, the comparator will produce a "1" output at the first timing interval if the output of the sample and hold circuit is positive, and a "0" output if it is negative. The control logic is arranged so that a "1" output will cause the output of the decoder to remain at zero during the first bit generation and a "0" output will cause the −16 stage of the decoder to be set, producing a −16 relative output. This operation represents the first sign bit check in the circuit. At the second timing interval, the +8 stage of the decoder is set and the decoder output will be the summation of the outputs of this stage and the −16 stage. The decoder output is again compared to the output of the sample and hold circuit in the comparator. When the output of the sample and hold circuit is larger than the decoder output, the comparator will produce a "1" and when it is smaller, the comparator will produce a "0." When a "1" is produced, the +8 stage remains set but when a "0" is produced, the +8 stage is reset to zero. At the third timing interval, the operation for the +8 stage is repeated for the +4 stage of the decoder. Then the first three bits generated by the comparator, which represent the state of the first three stages of the decoder, are checked. When they represent (000) or (111) the decoder output is made zero at the next timing pulse. This is done by summing in an additional voltage (or current) when the code is (111) and doing nothing when it is (000). With the output of the decoder set to zero, the output of the comparator will indicate a new determination of polarity. When this new polarity is the same as the previous polarity, the circuit will remove any additional voltage applied and continue generating the remaining bits of the digital word at succeeding timing intervals. However, if the new sign bit is different than the original sign bit, the first three outputs of the decoder will be corrected before the circuit continues to generate the remaining bits of the digital word. There are several ways of correcting the erroneous bits. However, they all involve adding a +4 to the code previously generated when the previous sign was negative or a −4 when the previous sign was positive. This is accomplished either by setting a group of auxiliary flip-flops which can override the outputs of the various stages of the decoder or by correcting the stages of the decoder itself.

The foregoing and other features of the present invention will be more readily apparent from the following detailed description and the drawings.

DETAILED DESCRIPTION

Figure 1:
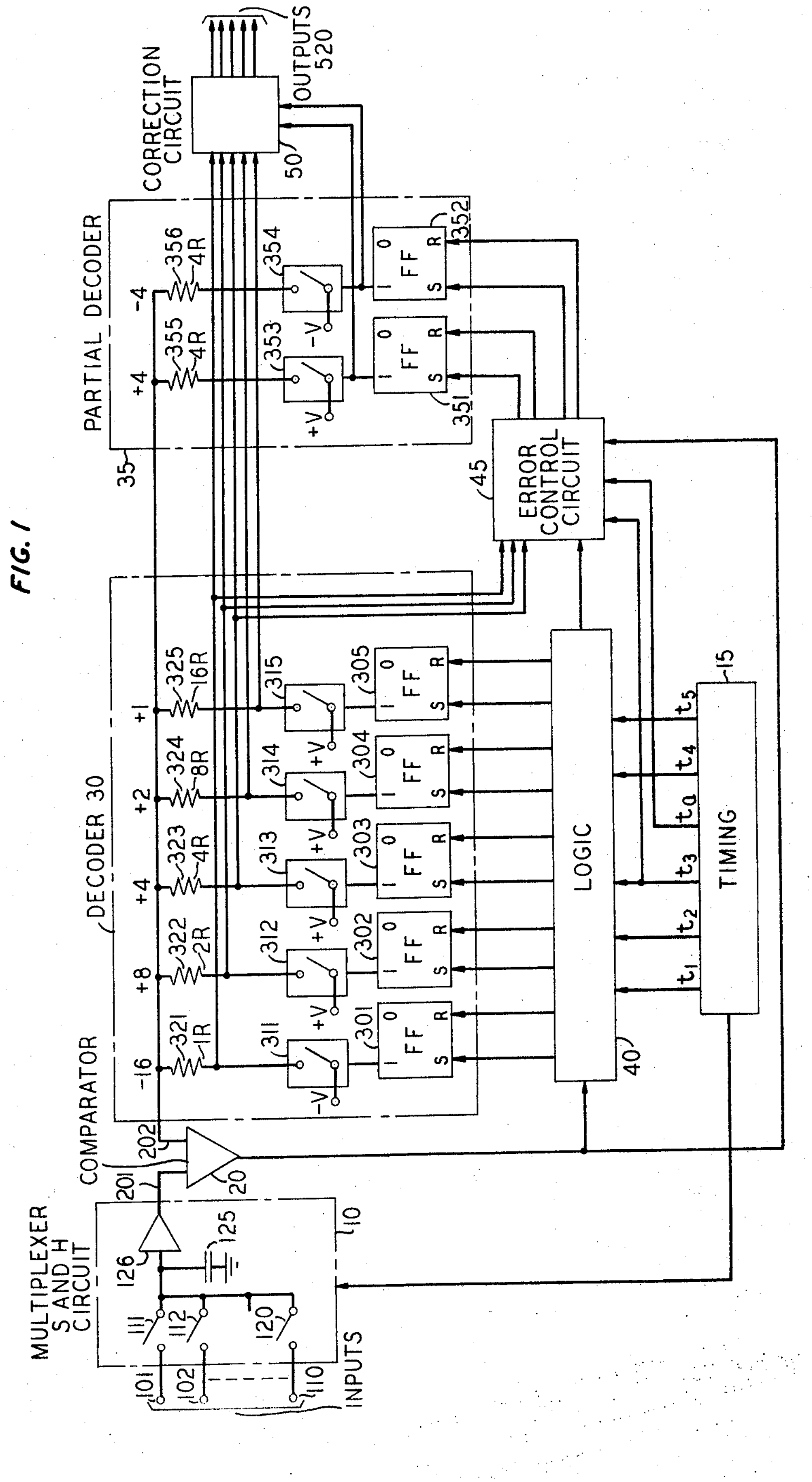
FIG. 1 is a schematic of an illustrative embodiment of the invention.

FIG. 1 is a schematic of an illustrative embodiment of the present invention. Multiplex sample and hold circuit 10, timing circuit 15, comparator 20 and decoder 30 are arranged in the same manner as a prior art multiplex successive approximation A/D converter. Analog input signals are applied to the ten input terminals (101 through 110) of the multiplex sample and hold circuit 10. These input signals can be independent of each other and can assume both positive and negative values in representing input information. The multiplexer section of circuit 10, represented by switches 111 through 120, sequentially applies the input signals to capacitor 125 of the holding circuit in response to signals from timing circuit 15. A unity gain high impedance amplifier 126 is used to buffer the sampled voltage on capacitor 125 without drawing off a substantial amount of charge. The output of this amplifier 126 is then equivalent to the sampled voltage but is capable of driving the input stage of comparator 20.

Figure 2:
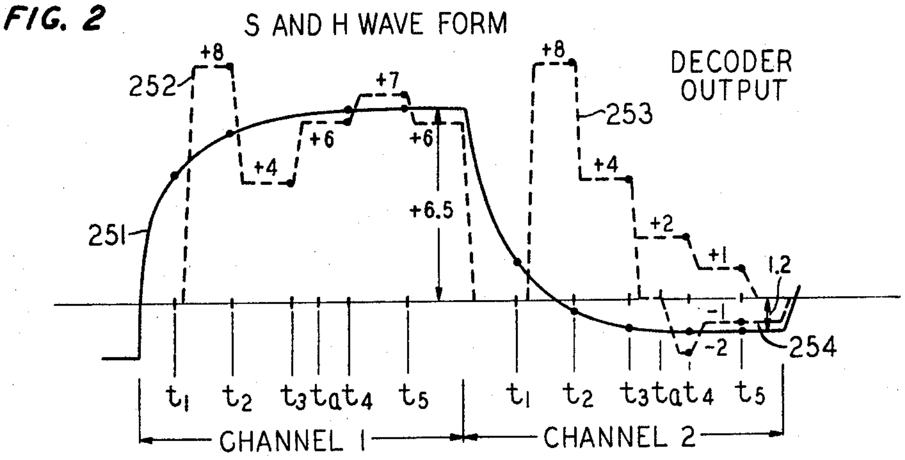
FIG. 2 is a graph of a typical output from the sample and hold circuit of FIG. 1 with the output of the decoder of FIG. 1 superimposed on it.

If, for example, the input voltage at terminal 101 is +6.5 volts during a period when it is connected to the holding circuit and the voltage at terminal 102 is −1.2 volts during the next sampling period, a voltage wave form like that shown by the solid curve 251 of FIG. 2 will be produced at the output of amplifier 126. This shows that the output signal has a transient response which is due to the source resistance of the various input channels and the holding capacitor 125. When the succeeding samples represent different information channels, this transient effect is called channel cross-talk, since the tail of one sample extends into the timing period for the next channel.

The output of sample and hold circuit 10 and the output of decoder 30 are applied to inputs 201 and 202 of comparator 20, respectively. Comparator 20 compares the two signals and generates a digital "1" when the output of circuit 10 is more positive than the output of decoder 30, and a digital "0" when it is not. These digital signals are then applied to logic circuit 40 which controls the output of the decoder. This feedback loop is responsible for the name of this type of A/D converter. At times $t_1$, $t_2$ and $t_3$, indicated in FIG. 2, the states of the first three flip-flops of decoder 30 (301, 302 and 303) are determined by logic circuit 40 in response to the comparator output. The time $t_a$ in FIG. 2 is used to implement the present invention, and the states of the fourth and fifth flip-flops of decoder 30 (304 and 305) are determined at times $t_4$ and $t_5$. The "1" outputs of these flip-flops control the switches 311 through 315 of decoder 30. One side of switch 311 is connected to a negative reference voltage, −V, and the other side is connected to one end of resistor 321. Switches 312 through 315 have one side connected to a positive reference voltage, +V, and the other side connected to one end of resistors 322 through 325, respectively. The other ends of these resistors are connected together and form the output of the decoder. These resistors (321 through 325) have relative resistances of R, 2R, 4R, 8R and 16R, respectively. Therefore, if terminal 202 of comparator 20 is a summing junction and the current through resistor 325 is given an arbitrary value of 1, the currents through resistors 321 through 324 will be −16, +8, +4 and +2, respectively. Also, the current applied to input 201 of comparator 20 will be the summation of the currents from the various stages of the decoder.

Comparator 20, with the decoder arranged as shown in FIG. 1, could be an operational amplifier followed by a threshold detector. Input 201 would be the PLUS input terminal of the amplifier, input 202 would be the MINUS input terminal, and a feedback resistor R would be connected between the output of the amplifier and input 202. In this situation, the negative reference voltage source would be equal to −16 volts and the positive reference voltage source would be equal to +16 volts. Then the equivalent decoder output voltage would be equal to the summation of the reference voltages associated with the flip-flops which have been SET, with each such voltage multiplied by the ratio of resistance R to the series resistance associated with the set flip-flop. By way of example, when flip-flops 302 and 304 are the only ones SET, the equivalent decoder output voltage would be $$+16 \times (r/2R) + 16\,(R/8R) = 10 \text{ volts.}$$

It is this equivalent voltage which is compared to the sample and hold circuit output voltage. This voltage is referred to as an equivalent output voltage because it does not actually exist anywhere in the circuit. Actually, the currents through the various series resistances are summed by the amplifier, thus producing an effect which would be the same as applying the summation of all the voltages represented by the various stages.

The circuit of FIG. 1, as described above, is representative of prior art circuits. Its operation can be better understood if it is assumed that the +6.5 volt sample, shown as the channel 1 portion of curve 251 in FIG. 2, has been applied to holding capacitor 125. This signal is compared with the output of the decoder, which has been initially set to zero. Since the sample and hold voltage is more positive than zero, a "1" bit is generated by the comparator. This "1" bit indicates that the input signal is positive. This "1" bit is also used in the logic circuit to prevent flip-flop 301 from being SET. In the time between $t_1$ and $t_2$, flip-flop 302 is SET. This closes switch 312, which causes a current to flow through resistor 322 to comparator input 202. This has the effect of making a +8 volt level available for comparison with the output of the sample and hold circuit. This can be seen as a portion of the dotted curve 252 in FIG. 2. At the same time $t_2$, the next comparison is made and a "0" bit is generated, since a +8 volt level is more positive than a +6.5 volt level. In the interval between $t_2$ and $t_3$, the logic circuit causes flip-flop 302 to be reset in response to the "0" bit from the comparator and flip-flop 303 to be set. This closes switch 313, which causes a current to flow through resistor 323. Since resistor 323 has twice the resistance of resistor 322, this current has the effect of making a +4 volt level available for comparison with the output of the sample and hold circuit. At time $t_3$, the output of the decoder, represented by the dotted curve 252 in FIG. 2, is compared with the output of the sample and hold circuit, represented by solid curve 251. This will cause the comparator to generate a "1" bit since the sample and hold voltage is larger than the decoder voltage. This "1" bit will cause the logic circuit to keep flip-flop 303 set. During the timing interval between $t_3$ and $t_4$, flip-flop 304 is set in addition to flip-flop 303. It should be noted that timing signal $t_a$ is not used in a conventional A/D converter. Because of the relative value of resistor 324, setting flip-flop 304 has the effect of adding a +2 volt level to the +4 volt level generated by flip-flop 303. At time $t_4$, another comparison is made and another "1" bit is generated, which causes flip-flop 304 to remain set. Then, during the period between times $t_4$ and $t_5$, flip-flop 305 is set in addition to flip-flops 303 and 304. This causes a +1 volt level to be added to the +6 volt level generated by flip-flops 303 and 304. At time $t_5$, the comparison is made again and this time a "0" bit is generated since the decoder output of +7 volts is larger than the +6.5 volts from the sample and hold circuit. The logic circuit resets flip-flop 305 in response to this "0" bit. Then the digital code representing the closest approximation to the input signal is read from the states of the flip-flops. Since flip-flops 303 and 304 are the only ones which are still set, the code is (00110).

Now that the operation of a typical prior art feedback type successive approximation A/D converter has been described, the particular problem to be overcome by the present invention can be examined. By referring to FIG. 2, it can be seen that during the period between $t_5$ of channel 1 and $t_1$ of channel 2, the decoder is reset and the multiplexer section of circuit 10 in FIG. 1 switches to a new input channel. In the example of FIG. 2, the new input sample is −1.2 volts. At $t_1$ for channel 2, which is the time when the sign bit is to be determined, the signal has not yet reached its steady state value. In fact, the signal is still positive. Therefore, the first comparison will cause the wrong sign bit to be given to the digital code. Also, since the −16 volt level of flip-flop 301 will not be set, the decoder output will always be positive and the decoder will be unable to generate the remaining bits of the code correctly. This is shown by the dotted curve 253 in FIG. 2. This curve is produced because the comparison at $t_1$ in channel 2 prevents flip-flop 301 from being set. Therefore, when the outer stages of the decoder are set and comparisons are made at times $t_2$, $t_3$, $t_4$ and $t_5$, the decoder output will always be more positive than the output of the sample and hold circuit. This causes each flip-flop to be reset as the comparison is made, thereby causing the generated code to be (00000).

One way to avoid this problem is to wait until time $t_2$ before beginning the coding process. With that restriction, a "0" bit will be generated by the comparator at time $t_2$. This will cause flip-flop 301 to set, producing a −16 volt equivalent decoder output. Then, between times $t_2$ and $t_3$, flip-flop 302 will be set, causing +8 volts to be added to the −16 volts established by flip-flop 301. At time $t_3$, this −8 volts will be compared with the −1.2 volt signal and a "1" bit will be generated. This will cause flip-flops 301 and 302 to remain set, while flip-flop 303 is being set during the interval between times $t_3$ and $t_4$. At time $t_4$, the −4 volt level generated by these three flip-flops will be compared with the −1.2 volt level and another "1" bit will be generated. Flip-flop 303 will remain set and flip-flop 304 will be set, so that a −2 volt level will be established for the comparison at time $t_5$. At time $t_5$ another "1" bit will be generated, which will keep flip-flop 304 set. However, now another timing period will be required to make up for the period lost when the decoding was delayed past the period between times $t_1$ and $t_2$. This extra period will be between times $t_5$ and a new time, $t_6$. In this period, flip-flop 305 will be set, producing an equivalent decoder output of −1 volt. At time $t_6$, a "0" bit will be produced, since a −1 volt level is more positive than −1.2 volts. The code will then be read from the flip-flops as (11110), which is the two's complement of the correct answer. Since this method requires an additional timing period, the rate of comparison will be slower. However, with the present invention, the correct code can be generated without reducing the conversion rate.

To implement the present invention, partial decoder 35, error control circuit 45, and correction circuit 50 are added to the basic configuration, as shown in FIG. 1. These circuits modify the operation of the basic configuration by setting the output to zero between times $t_3$ and $t_a$; making a new sign but determination; and correcting the first three bits of the code if the second sign bit does not match the first. In order to determine if a second sign bit check is to be made, the circuits of the present invention determine if the output code generated before time $t_a$ is near zero. This is done in order to determine if an activity similar to that shown by the dotted curve 253 in FIG. 2 is going on. The codes which represent signals near zero can be determined by considering the following code conversions:

| Equivalent Decoder Output | Flip-Flop States 301 | 302 | 303 | 304 | 305 |
|---|---|---|---|---|---|
| +9 | 0 | 1 | 0 | 0 | 1 |
| +8 | 0 | 1 | 0 | 0 | 0 |
| +7 | 0 | 0 | 1 | 1 | 1 |
| +6 | 0 | 0 | 1 | 1 | 0 |
| +5 | 0 | 0 | 1 | 0 | 1 |
| +4 | 0 | 1 | 1 | 0 | 0 |
| +3 | 0 | 0 | 0 | 1 | 1 |
| +2 | 0 | 0 | 0 | 1 | 0 |
| +1 | 0 | 0 | 0 | 0 | 1 |
| 0 | 0 | 0 | 0 | 0 | 0 |
| −1 | 1 | 1 | 1 | 1 | 1 |
| −2 | 1 | 1 | 1 | 1 | 0 |
| −3 | 1 | 1 | 1 | 0 | 1 |
| −4 | 1 | 1 | 1 | 0 | 0 |
| −5 | 1 | 1 | 0 | 1 | 1 |
| −6 | 1 | 1 | 0 | 1 | 0 |
| −7 | 1 | 1 | 0 | 0 | 1 |
| −8 | 1 | 1 | 0 | 0 | 0 |
| −9 | 1 | 0 | 1 | 1 | 1 |

From this table of code conversions it can be seen that when the code for the first three bits generated (301, 302 and 303) is (000), which indicates a decoder output between zero and +4, or (111), which represents a decoder output between zero and −4, conditions are such that a second sign bit check should be made.

Error control circuit 45 detects the occurrence of these codes and generates signals which will make the decoder output zero. The decoder output is set to zero so that it can be compared with the sample and hold voltage in order to make the subsequent determination of the polarity of the input signal sample. Since flip-flops 351 and 352 of partial decoder 35 are initially zero, the occurrence of (000) code for the first three bits does not require any action by the error control circuit. However, since the code (111) for the first three bits represents −4 (11100), a +4 current must be generated and added to the decoder output in order to set it to zero. This correction voltage is generated in the partial decoder 35. Flip-flops 351 and 352 of the partial decoder are controlled by the error control circuit 45. The "1" outputs of these flip-flops are used to control switches 353 and 354. One side of switch 353 is connected to the positive reference potential, +V, and the other side is connected to one end of resistor 355. The other end of resistor 355 is connected to the partial decoder output. Switch 354, which is under the control of flip-flop 352, has one side connected to the negative reference potential, −V, and the other side connected to one end of resistor 356. The other end of resistor 356 is connected to the partial decoder output. The partial decoder output itself is connected to the output of the full decoder 30.

When the first three bits are (111), the error control circuit causes the decoder output to be zero by setting flip-flop 351. This causes an additional +4 current to flow into terminal 302 of comparator 20. This is represented by the section of dotted curve 254 in FIG. 2 between times $t_3$ and $t_a$. The error control circuit which performs this operation is shown in FIG. 3.

Figure 3:
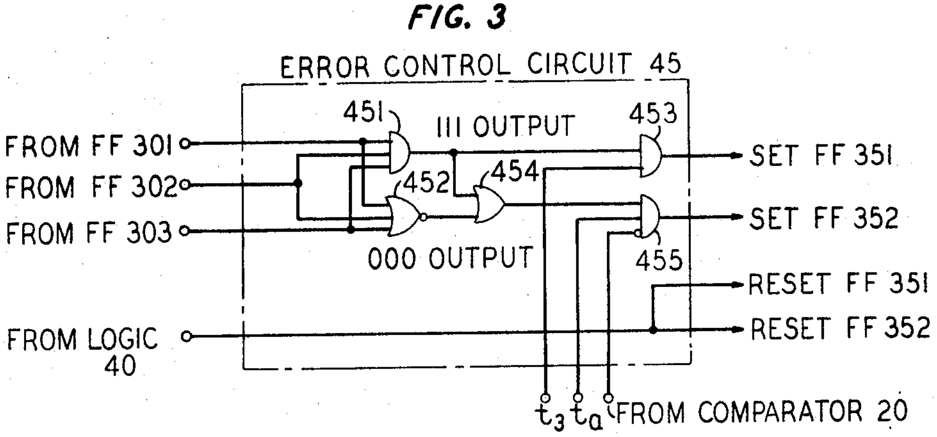
FIG. 3 is a schematic of the error control circuit of FIG. 1.

In the error control circuit of FIG. 3 the "1" outputs of flip-flops 301, 302 and 303 are applied to the inputs of three-input AND gate 451, respectively. The outputs of these flip-flops are also applied to the inputs of three-input NOR gate 452. T An output from AND gate 451 indicates that a (111) code has been detected and an output from NOR gate 452 indicates that a (000) code has been detected. The output of AND gate 451 and timing pulse $t_3$ are applied to the respective inputs of two-input AND gate 453. The output of this gate is used to SET flip-flop 351 in the partial decoder 35. The outputs of AND gate 451 and NOR gate 452 are combined in two-input OR gate 45. The output of this gate and timing pulse $t_a$ are applied to the normal inputs of INHIBIT AND gate 455. The output of comparator 20 is applied to the inhibit terminal of INHIBIT AND gate 455 and the output of this gate is used to set flip-flop 352. The resets for flip-flops 351 and 353 are generated in the logic circuit 40. Generally, the reset pulse is generated while the multiplexer circuit is switching channels.

With this arrangement, flip-flop 351 will be SET at time $t_3$ whenever a (111) code has been generated. This, of course, will cause the equivalent decoder output to be forced to zero. INHIBIT AND gate 455 will SET flip-flop 352 at time $t_a$, depending on the output of comparator 20. The comparison to determine the state of flip-flop 353 takes place at time $t_a$. If the sign bit determined at that time is the same as the sign bit generated previously, then flip-flop 351 will be reset if it had been set during the interval between times $t_3$ and $t_4$. If the subsequent sign bit is different than the previous sign bit and the code was (000), then the error control circuit sets flip-flop 352 of the partial decoder, which adds a −4 current to the zero output of decoder 30. Thus, its effective code is changed from (000) to (111), which equals −4. However, if the code was initially (111) and the two sign bits did not match, then flip-flop 351 remains set, thus keeping the decoder output at zero. This, of course, results in a code change from (111) to (000). During the interval between times $t_a$ and $t_4$, flip-flop 304 of decoder 30 is set. Then at time $t_4$ a comparison is made and flip-flop 304 either remains SET or is RESET in the normal manner. The normal circuit operation is also carried out for flip-flop 305.

It should be noted that this arrangement only allows for a +4 or a −4 volt correction. If the actual signal was greater than this limit, the code generated would still be incorrect. However, this arrangement relies on the fact that a larger voltage difference would cause the sample and hold output voltage to cross the zero axis at a much sooner time, thus causing the first sign bit to be correct. Also, the circuit can be modified to make the subsequent sign bit check between times $t_2$ and $t_3$. This would allow a +8 or a −8 volt correction.

If the sample input of FIG. 2 is used, the operation of the present invention can be explained. As described previously, the first three bits generated for the −1.2 volt sample will be (000). This is shown by the first part of dotted curve 253. Since this indicates that a new sign bit check should be made, the logic circuit 40 does not set flip-flop 304 and the output of decoder 30 drops to zero, as shown by dotted curve 254. At time $t_a$ the sign bit is checked and is found to be negative. Since it differs from the first sign bit, the error control circuit, between times $t_a$ and $t_4$, causes flip-flop 352 to be set, which generates a −4 volt level. However, at the same time, flip-flop 304 is set by logic circuit 40. This adds in a +2 volt level, thus making the equivalent decoder output voltage −2 volts. At $t_4$ a comparison is made and a "0" is generated. This causes flip-flop 304 to reset and flip-flop 305 to set, producing a −1 volt level. At time $t_5$ the final comparison is made and a "1" is generated.

With the error control circuit's operation on the partial decoder, only the equivalent output of decoder 30 has been corrected. Therefore, steps must be taken to correct the actual digital output code. Information about the correct code can be determined by looking at the states of the flip-flops in the partial decoder. The first and second sign bits are stored in flip-flops 351 and 352, respectively. Correction circuit 50 uses this information to determine what the first three bits of the correct code should be. If both flip-flops 351 and 352 are reset, or if they both are set, which means that the two sign bits were the same, then the states of flip-flops 301, 302 and 303 of decoder 30 are transferred directly to the output 520. However, if flip-flop 351 is reset and flip-flop 352 is set, the output is corrected from (000) to (111). Also, if flip-flop 351 is set and flip-flop 352 is reset, the output is corrected from (111) to (000). The error correction circuit which performs these operations is shown in FIG. 4.

Figure 4:
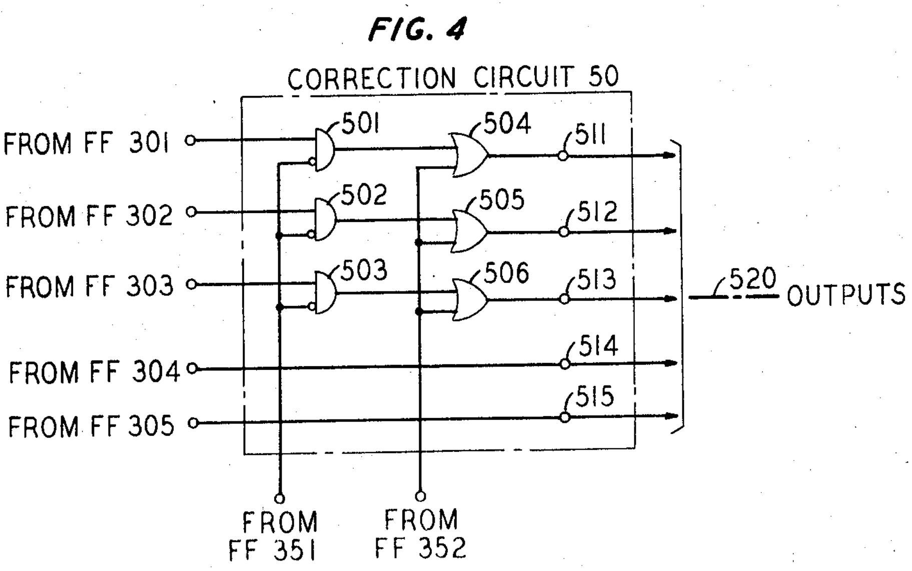
FIG. 4 is a schematic of the correction circuit of FIG. 1.

The error correction circuit of FIG. 4 accepts the "1" inputs from flip-flops 301 through 305 and flip-flops 351 and 352. The inputs from flip-flops 301 through 303 are applied to the inputs of INHIBIT AND gates 501 through 503, respectively. The inhibit terminals of these gates are all connected to the output of flip-flop 351. The outputs of INHIBIT AND gates 501 through 503 are applied to the inputs of two-input OR gates 504 through 506, respectively. The other inputs of these OR gates are all connected to the output of flip-flop 352. The outputs of these three two-input OR gates are the first three bits of the corrected output code and the two inputs from flip-flops 304 and 305 are simply transferred to the output of the correction circuit as the last two bits of the corrected code. With this arrangement, "0's" from flip-flops 351 and 352 would cause (000) at output terminals 511 through 513. Also, "1's" from flip-flops 351 and 352 would cause (111) at output terminals 511 through 513 because the inputs from flip-flops 301 through 303 would also be "1's." A "0" from flip-flop 351 and a "1" from flip-flop 352 would make the output (111) because the "1" from flip-flop 352 would pass through OR gates 504 through 506 to the output. A "1" from flip-flop 351 and a "0" from flip-flop 352 will produce a (000) at the output because the outputs of INHIBIT AND gates 501 through 503 will be zero also under these conditions.

At this point it should be noted that the partial decoder 35 and correction circuit 50 can be eliminated. Under this alternative arrangement, the error control circuit would be used to set flip-flops 301, 302 and 303 to (111) or reset them to (000) in order to make the decoder output "0" for the subsequent sign bit check or to correct the output code. This alternative arrangement would, of course, be simpler than the embodiment shown in FIG. 1. However, from a practical point of view this simple configuration would produce a large transient wave form whenever flip-flop 301 was reset, since it controls the −16 volt equivalent level. Switching such a large voltage in a short period of time may be hampered by stray capacitance in the decoder. Therefore, it may require increasing the period between $t_3$ and $t_a$ to avoid errors. This would, of course, defeat the purpose of speeding up the comparison time. The circuit in FIG. 1 was devised so as to avoid this large transient in the process of making the second sign bit decision by producing only incremental changes with the partial decoder 35.

It can be seen from the description of the present invention that its operation can be divided into two portions; that portion of the coding before the second sign bit decision and that portion after it.

Figure 5:
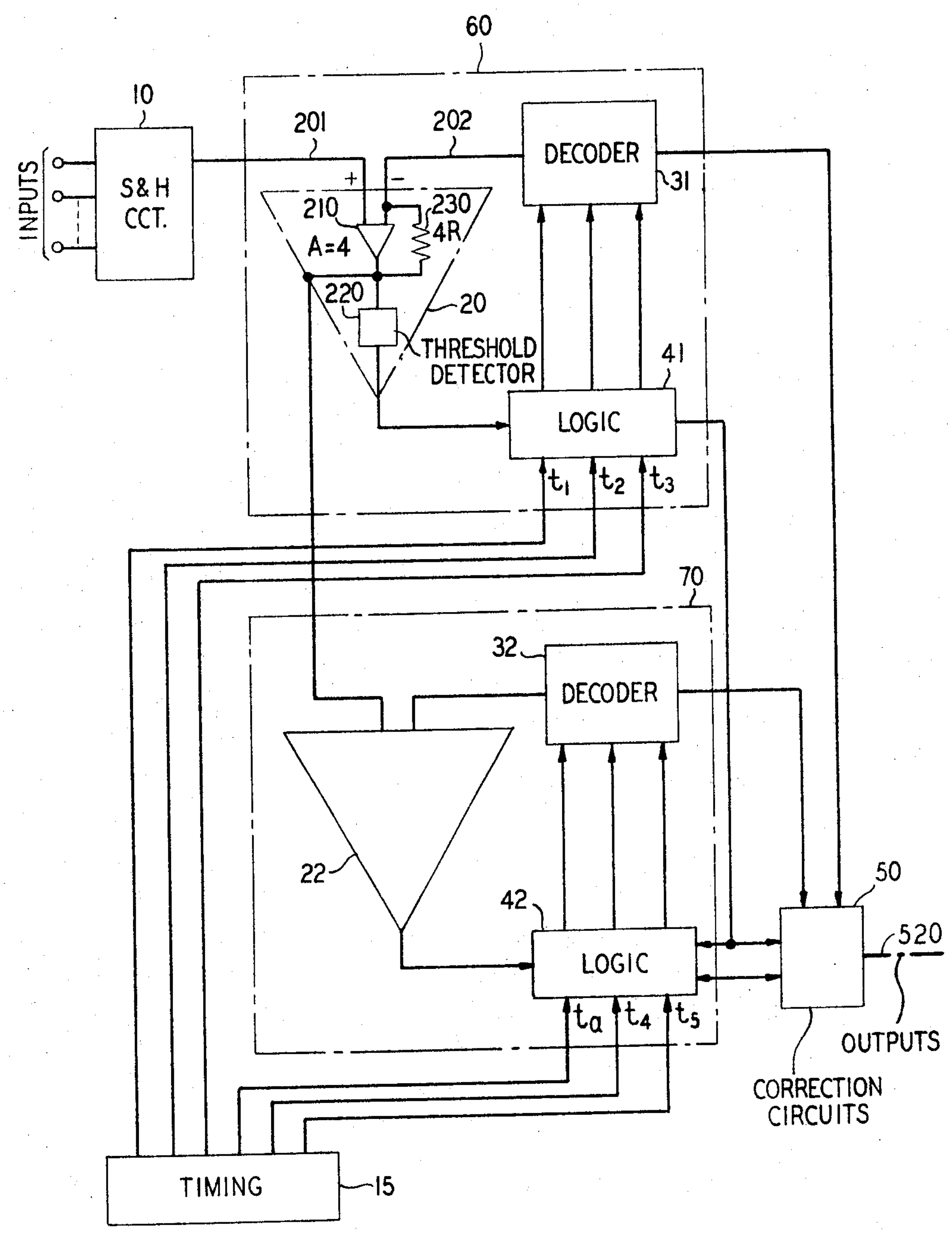
FIG. 5 is a schematic of an alternative arrangement of the circuit of FIG. 1.

FIG. 5 is an alternative arrangement of the circuit of FIG. 1, which makes use of this feature of the coder's operation. Those parts in FIG. 5 which are the same as parts in FIG. 1 have been given the same numerical designation. FIG. 5 uses the same multiplex sample and hold circuit 10 of FIG. 1 which applies an input to terminal 201 of comparator 20. The decoder and logic functions in FIG. 1 have been broken up into two coders (60 and 70), which are arranged in cascade. The comparator 22 of FIG. 5, which is part of coder 70, is the same as comparator 20 in FIGS. 1 and 5. The decoder 31 of FIG. 5 includes resistors 321, 322 and 323; switches 311, 312 and 313; and flip-flops 301, 302 and 303 of FIG. 1. The logic circuit 41 includes the corresponding three digit portions of the logic circuit 40 in FIG. 1. During comparison times $t_1$, $t_2$ and $t_3$, this coder, 60, generates the first three bits of the output digital code.

In the second coder 70, the decoder 32 includes those portions of decoder 30 in FIG. 1 which generate the last two bits of the output digital code and also all of partial decoder 35 of FIG. 1. The logic circuit 42 includes those portions of logic circuit 40 in FIG. 1 which were not included in logic circuit 41 and also the error control circuit 45 of FIG. 1. Therefore, except for the extra comparator 22 and its connection to comparator 20, the circuit of FIG. 5 is the same as the circuit of FIG. 1. However, constituent parts of comparator 20 are shown in FIG. 5. In comparator 20 the sample and hold circuit 10 is connected to the PLUS input of operational amplifier 210 and the output of decoder 31 is connected to the MINUS input of amplifier 210. A resistor 230 which has a relative resistance of $4R$ is connected between the output and the negative input of the operational amplifier 210. This gives the amplifier a gain of 4. A threshold circuit is connected to the output of amplifier 210 and it converts the comparison signal into digital bits. When the first three bits are detected, the remaining difference between the sample and hold output and the output of decoder 31 is present at the output of the operational amplifier. This difference is applied to one of the inputs of comparator 22 so that the lower order bits can be determined. The values of the resistances of decoder 32 are adjusted to take into consideration the gain in amplifier 210. Operational amplifier 210 is given gain since the encoding of the higher order digits in coder 60 requires greater accuracy than the encoding of the lower order bits. With a gain of 4 in amplifier 210, the decoder levels in decoder 32 must be adjusted so that the smallest level in it is the same as the smallest level in decoder 31. Therefore, division of the circuit into two cascaded coders has the additional advantage of avoiding the necessity of making the decoder levels in decoder 32 so small that they are overwhelmed by the system noise. The correction circuit 50 takes the outputs from both decoders and signals from the logic circuits and corrects the output in the same manner as the circuit in FIG. 1.

The embodiments described so far have involved three bits before the second sign bit decision and two bits after it. In general, the circuit can be said to have $m$ digits before and $n$ digits after the second sign bit check. This will allow for a correction range of $\pm 2^n$. If one needs to have a wider correction range, the number of stages before the second sign bit check, $n$, are simply increased.

While the invention has been particularly shown and described with reference to preferred embodiments thereof, it will be understood by those skilled in the art that various changes in form and details may be made therein without departing from the spirit and scope of the invention. In particular, the linear coding scheme presented can be replaced by a nonlinear one and the sequential comparison coder can be replaced by other types of known coders, such as the counting type.

I claim:

1. An analog-to-digital converter for converting an analog signal into a digital code comprising:

a source of samples of an analog signal;

means for sequentially generating the bits of the digital code for a particular sample of the analog signal, the first digit generated being indicative of the sign of the sample of the analog signal;

means for determining the sign of the sample of the analog signal at a preselected time after the generation of the first bit of the digital code and before the entire code for that sample has been generated, and generating a subsequent sign bit in response to the check; and means for comparing the first bit of the digital code with the subsequent sign bit and correcting the digital code when the sign bits differ.

2. A sequential analog-to-digital converter circuit which generates a digital representation of samples of bipolar input signals comprising:

means for generating timing pulses;

means responsive to the timing pulses for sampling the amplitude of the input signals and maintaining the sampled amplitude for a first period of time;

an analog comparison means having two inputs for comparing the amplitude of signals applied to its inputs and generating digital bits in response to the comparison, the sampled amplitude being applied to a first input of said comparison means;

means for generating control signals in response to the digital bits and the timing pulses;

decoding means having a plurality of stages for producing an equivalent analog signal by activating stages of said decoding means in response to the control signal, the equivalent analog signal being applied to a second input of said comparison means;

means for checking the stages of said decoding means after a preselected number of digital bits have been generated for forcing the equivalent analog signal to be zero for a fixed period of time whenever the stages are in predetermined conditions;

a digital comparison means having two inputs for comparing the digital bit generated by said analog comparison means during the fixed period of time with the first digital bit generated for the sampled amplitude and generating an output when the bits differ;

means for continuing the analog-to-digital conversion after the fixed period of time has ended; and output means for generating the output of said converter circuit in response to the state of the stages of said decoding means and the output of said digital comparison means.

3. A sequential analog-to-digital converter circuit which generates a digital representation of samples of bipolar input signals comprising:

a source of timing pulses;

a multiplex sample and hold circuit responsive to the timing signals for sequentially sampling the amplitude of a plurality of bipolar input signals and holding the samples while a digital representation of each is generated;

an analog comparator having two inputs for comparing the amplitude of signals applied to its inputs, and generating a digital "1" when the signal applied to a first input is more positive than the signal applied to a second input, and a digital "0" when it is not, the samples of the input signal from said multiplex sample and hold circuit being applied to the first of said analog comparator;

a logic circuit for generating a first set of control signals in response to the output of said analog comparator and the timing pulses;

a decoder having a plurality of stages activated by the first set of control signals, said decoder producing an equivalent analog output signal that is the summation of the weighted outputs of its stages, the equivalent analog output signal being applied to the second input of said analog comparator;

a partial decoder having a plurality of stages activated by a second set of control signals, said partial decoder producing an output signal that is dependent on the stage activated, the output signal of said partial decoder being summed with the equivalent analog output signal of said decoder at the second input of said analog comparator;

an error control circuit for producing the second set of control signals after a preselected number of the digital bits of the code have been generated in response to the state of the stages of said decoder and the timing pulses, the second set of control signals operating on said partial decoder so as to cause the signal at the second input of said analog comparator to be zero for a fixed period of time when the bits generated have predetermined codes, the second set of control signals also operating subsequently on said partial decoder in response to the output of said analog comparator during the fixed period of time in such a way as to correct the signal applied to the second input of said analog comparator when the first digital bit generated by the comparator for a particular sample does not match the digital bit generated during the fixed period of time; and an output circuit for producing output signals in response to the states of the stages of said decoder modified by the states of the stages of said partial decoder.

4. A sequential analog-to-digital converter as claimed in claim 3 wherein said decoder comprises:

five flip-flops whose states are controlled by the first set of control signals;

five switches each responsive to a separate one of said five flip-flops;

a first negative reference voltage applied to one terminal of the first switch of said five switches;

a first positive reference voltage applied to one terminal of the second, third, fourth and fifth switches of said five switches, said positive reference voltage being equal in magnitude to said negative reference voltage; and five resistors each having one end connected to the output of the decoder and each having the other end connected to the other terminal of a separate one of said five switches, the resistor connected to said first switch having a relative resistance R, and the resistances connected to said second, third, fourth and fifth switches having relative resistances of $2R$, $4R$, $8R$ and $16R$, respectively.

5. A sequential analog-to-digital converter as claimed in claim 3 wherein said error control circuit comprises:

a three-input AND gate for generating an output level whenever the states of said decoder indicate that the first three bits generated by said converter are (111);

a three-input NOR gate for generating an output level whenever the states of said decoder indicate that the first three bits generated by said converter are (000);

a two-input AND gate having the output of said three-input AND gate applied to one of its inputs and the third timing pulse after the start of the coding process applied to its other input, the output of said two-input AND gate being one of the second set of control signals;

a two-input OR gate having the output of said three-input AND gate applied to one input and the output of said three-input NOR gate applied to the other input; and a three-input INHIBIT AND gate having the output of said two-input OR gate applied to one input, the fourth timing pulse after the start of the coding process applied to the other input, and the output of said analog comparator applied to its INHIBIT input, the output of said two-input INHIBIT AND gate being another of second set of control signals.

6. A sequential analog-to-digital converter as claimed in claim 3 wherein said correction circuit comprises:

three two-input INHIBIT AND gates each having its input responsive to the state of a separate one of the first three stages of said decoder, the INHIBIT inputs of all of said three two-input INHIBIT AND gates being responsive to the state of the first stage of said partial decoder; and three two-input OR gates each having one input connected to a separate one of the outputs of said three two-input INHIBIT AND gates, the other inputs of all of said three two-input OR gates being responsive to the state of the second stage of said partial decoder, the outputs of said three two-input OR gates being the first three bits of the output code of said converter.

7. A sequential analog-to-digital converter as claimed in claim 3 wherein said partial decoder comprises:

first and second partial decoder flip-flops whose states are controlled by the second set of control signals;

first and second partial decoder switches, said first partial decoder switch being responsive to said first partial decoder flip-flop and said second partial decoder switch being responsive to said second partial decoder flip-flop;

a partial decoder positive reference voltage applied to one terminal of said first partial decoder switch;

a partial decoder negative reference voltage applied to one terminal of said second partial decoder switch;

a first partial decoder resistor connected between the output of said partial decoder and the other end of said first partial decoder switch; and a second partial decoder resistor connected between the output of said partial decoder and the other end of said second partial decoder switch.

8. A sequential analog-to-digital converter circuit which generates a digital representation of samples of bipolar input signals comprising:

a source of timing pulses;

a multiplex sample and hold circuit responsive to the timing pulses for sequentially sampling the amplitude of a plurality of bipolar input signals and holding those samples while the digital representation of each is generated;

a first analog comparator having two inputs for connecting the amplitude of two signals applied to its inputs, and generating a digital output depending on which input is more positive and an analog output depending on the difference in the amplitude of two signals, the samples of the input signal from said sample and hold circuit being applied to a first input of said first analog comparator;

a first logic circuit which generates a first set of control signals in response to the digital output of said first analog comparator and the timing pulses;

a first decoder having a plurality of states activated by the first set of control signals, said first decoder producing a first equivalent analog output signal that is the summation of the weighted outputs of its stages, the first equivalent analog output signal being applied to the second input of said first analog comparator;

a second analog comparator having two inputs for comparing the amplitude of the two signals applied to it and generating a digital output depending on which input is more positive, the analog output of said first analog comparator being applied to a first input of said second analog comparator;

a second decoder having a plurality of stages activated by a second set of control signals, said second decoder producing a second equivalent analog output signal that is the summation of the weighted outputs of its stages, the second equivalent analog output signal being applied to a second input of said second analog comparator;

a second logic circuit which generates the second set of control signals after said first set of control signals has been generated, said second set of control signals being generated in response to the digital output of said second analog comparator, the timing pulses, and the state of the stages of said first decoder, the second set of control signals operating on said second decoder so as to cause the signal at the second input of said second analog comparator to be zero for a fixed period of time when the states of the stages of said first decoder indicate a code near zero, the second set of control signals also operating subsequently on said second decoder in response to the output of said second analog comparator during the fixed period of time in such a way as to correct the signal applied to the second input of said second analog comparator when the first digital bit generated by said first analog comparator for a particular sample does not match the digital bit generated by said second analog comparator during the fixed period of time; and an output circuit for producing the output signals of the converter circuit in response to the states of said first and second decoder, and said second logic circuit.

* * * * *